United States Patent
Zopf

(10) Patent No.: US 12,236,958 B2
(45) Date of Patent: Feb. 25, 2025

(54) RETRANSMISSION SOFTBIT DECODING

(71) Applicant: Cypress Semiconductor Corporation, San Jose, CA (US)

(72) Inventor: Robert Zopf, Rancho Santa Margarita, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 453 days.

(21) Appl. No.: 17/307,375

(22) Filed: May 4, 2021

(65) Prior Publication Data
US 2022/0375479 A1    Nov. 24, 2022

(51) Int. Cl.
| | |
|---|---|
| G10L 19/005 | (2013.01) |
| G10L 19/16 | (2013.01) |
| H04L 1/00 | (2006.01) |
| H04L 1/20 | (2006.01) |
| H04W 4/80 | (2018.01) |
| H04W 28/04 | (2009.01) |

(52) U.S. Cl.
CPC .......... *G10L 19/005* (2013.01); *G10L 19/167* (2013.01); *H04L 1/0045* (2013.01); *H04L 1/0061* (2013.01); *H04L 1/203* (2013.01); *H04W 4/80* (2018.02); *H04W 28/04* (2013.01)

(58) Field of Classification Search
CPC .............................. G10L 19/005; G10L 19/167
See application file for complete search history.

(56) References Cited

U.S. PATENT DOCUMENTS

| | | | |
|---|---|---|---|
| 10,784,989 B2 | 9/2020 | Zopf | |
| 2004/0064778 A1* | 4/2004 | Widdup | H03M 13/2957 714/758 |
| 2005/0249296 A1* | 11/2005 | Axnas | H04L 1/0068 375/260 |
| 2007/0162788 A1* | 7/2007 | Moelker | H04L 1/20 714/704 |

(Continued)

OTHER PUBLICATIONS

Fingscheidt, T., & Vary, P. (2001). Softbit speech decoding: A new approach to error concealment. IEEE Transactions on Speech and Audio Processing, 9(3), 240-251.*

*Primary Examiner* — Bryan S Blankenagel

(57) ABSTRACT

Disclosed are methods and systems for using softbit decoding techniques in retransmission-based networks for error concealment of packets corrupted by bit-errors. The softbit decoding techniques derive softbit information from multiple corrupted hardbits of the retransmitted packet to aid a softbit decoder in decoding the packet. The approach realizes improved error concealment capability while maintaining a simple system architecture. A retransmission softbit module is inserted between a channel decoder used for channel-decoding and demodulating a compressed packet and the softbit decoder. The retransmission softbit module may derive an accumulated softbit packet from multiple corrupted copies of the packet received from the channel decoder, make bit decisions based on the accumulated softbit packet, and derive reliability information for the bit decisions. The bit decisions may be a majority decision packet (MDP) created using a majority voting scheme. The reliability information and the MDP may be provided to the softbit decoder for decoding.

18 Claims, 9 Drawing Sheets

(56) References Cited

U.S. PATENT DOCUMENTS

| | | | |
|---|---|---|---|
| 2007/0218936 A1* | 9/2007 | Waxman | H04H 20/72 |
| | | | 455/522 |
| 2008/0219387 A1* | 9/2008 | Choi | H04L 27/366 |
| | | | 375/346 |
| 2010/0278036 A1* | 11/2010 | Dai | H04B 7/15592 |
| | | | 370/216 |
| 2011/0072331 A1* | 3/2011 | Sakaue | G06F 11/1012 |
| | | | 714/763 |
| 2011/0286345 A1* | 11/2011 | Goue | H04L 1/205 |
| | | | 370/252 |
| 2012/0159282 A1* | 6/2012 | Ito | H03M 13/098 |
| | | | 714/752 |
| 2012/0300886 A1* | 11/2012 | Seibert | H04L 1/1867 |
| | | | 375/316 |
| 2013/0132798 A1* | 5/2013 | Jeon | H04L 1/0061 |
| | | | 714/766 |
| 2015/0110228 A1* | 4/2015 | Elenes | H04L 27/2657 |
| | | | 375/343 |
| 2016/0183098 A1* | 6/2016 | Lim | H04L 41/22 |
| | | | 455/12.1 |
| 2019/0288792 A1* | 9/2019 | Zopf | H04L 1/08 |
| 2020/0119845 A1* | 4/2020 | Chen | H03M 13/356 |
| 2021/0067269 A1* | 3/2021 | Chen | H03M 13/13 |
| 2022/0051746 A1* | 2/2022 | Zamir | G11C 29/46 |
| 2023/0275616 A1* | 8/2023 | Eleftheriadis | H04B 3/54 |
| | | | 375/257 |

\* cited by examiner

RETRANSMISSION SOFTBIT DECODING

TECHNICAL FIELD

The subject technology generally relates to wireless communication systems, and more particularly, to systems and methods for softbit decoding of data packets when applied to retransmission-based protocol of wireless communication systems such as a Bluetooth® network.

BACKGROUND

Bit errors are a hallmark of wireless communication links. Bit errors may be broadly categorized as random errors or burst errors. Random bit errors are evenly distributed across transmission packets in time and may be caused by a persistent channel impairment, such as a weak signal due to physical barriers or a long distance link. Bursty bit errors are localized in time and may be caused by a transient condition such as an interfering transmission or intermittent channel congestion. Audio, video, or other real-time communication over mobile wireless links may combat the effects of bit errors by using strong channel coding to ensure robust low-latency digital data delivery. However, bit-error corruption in data packets or frames still occurs and needs to be concealed at the receiver to prevent significant quality degradation. For example, in speech or audio transmission, depending on the speech or audio compression algorithm used, only a few bit errors may cause audible distortion if decoded.

One approach to combat quality degradation in audio, video, or other communication applications caused by bit errors is to discard the corrupted frames and to conceal the missing data by waveform extrapolation, waveform interpolation, statistical or other techniques using what is termed packet loss concealment (PLC). The term loss concealment or error concealment refers to the minimization of the effects on end-application quality such as audio or video caused by any bit errors. Though PLC may be reasonably successful at concealing low amounts of packet loss (<1%), it is wasteful in the sense that a complete frame of compressed information is discarded even if only a single bit was in error. PLC may also afford only limited improvement in quality unless advanced algorithms are used at the cost of significant computational complexity. Another approach is softbit decoding techniques that utilize reliability information about each bit extracted by a channel decoder to assist a decoder of the end application to synthesize the correct frame from the corrupted frame. Softbit decoding may achieve improved quality over PLC. However, its practical use may be limited by the architectural separation between the channel decoder and the digital signal processor (DSP) used for the data decoding.

Many wireless communication systems or protocols, such as Bluetooth Low Energy (BLE), use retransmissions to combat poor channel conditions instead of relying on strong channel coding. BLE audio carries real-time audio using a combination of retransmission, interleaving, and burst transmissions. It is assumed that retransmission may combat low levels of random bit errors, (i.e., an error-free packet is received after some reasonable number of retransmissions). For example, Bluetooth Classic Enhanced Synchronous Connection-Oriented (eSCO) link uses a preset number of retransmissions (usually 2). With Connected Isochronous Streams (CIS), a point-to-point or point-to-multipoint connection exists with acknowledgements to trigger retransmission, while in Broadcast Isochronous Streams (BIS), the audio stream is broadcast with a predefined number of retransmissions. In these retransmission-based protocols, the receiver may receive multiple copies of the same packet, all corrupted by error errors. It is desired to enhance the quality of audio, video, or other low-latency communication when using retransmission-based networks.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
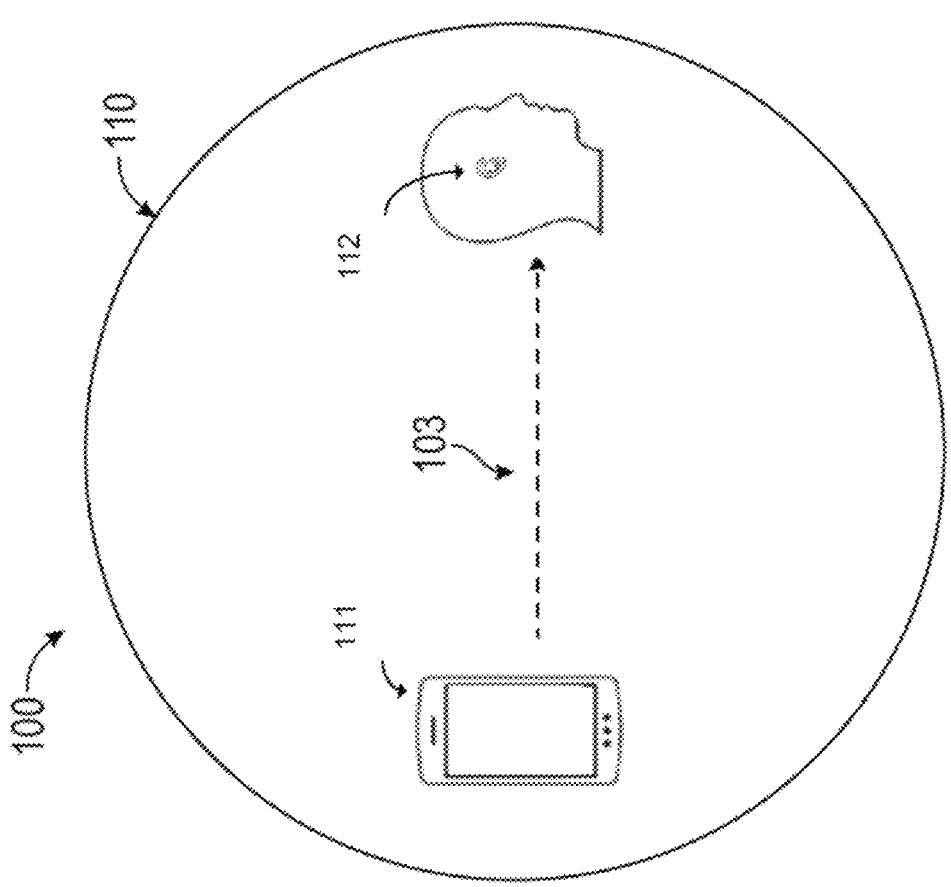
FIG. 1 illustrates an example wireless network architecture, in accordance with some embodiments of the present disclosure.

Examples of various aspects and variations of the subject technology are described herein and illustrated in the accompanying drawings. The following description is not intended to limit the invention to these embodiments, but rather to enable a person skilled in the art to make and use this invention.

In audio, video, sensor, or other types of information transmission across a wireless channel, the presence of bit-errors may cause significant degradation in the quality of the information content. For example, in speech or audio transmission, depending on the speech or audio algorithm used, only a few bit-errors can cause audible distortion when frames of compressed audio data are decoded. Error concealment or loss concealment techniques are used to minimize or eliminate the deleterious effects on the quality of the received information caused by any bit-errors.

Wireless transmission systems may include an integrity check such as a cyclic redundancy check (CRC) that may detect the presence of bit-errors in a frame or packet at a receiver of the wireless transmission. The most common error concealment approach is driven by a binary bad frame indicator (BFI) that is set based on the results of the integrity check. In an error concealment approach generally termed packet loss concealment (PLC), if the BFI is triggered, the receiver may discard the corrupted frame and may attempt to conceal the gap represented by the discarded frame by employing a variety of techniques. For example, simple PLC approaches may fade to zero or perform a frame repeat, by either repeating the last decoded frame, or repeating the last correctly received compressed frame and passing it through the decoder. More advanced PLC approaches may use extrapolation, interpolation (e.g., if future frames are available), statistical, or other techniques in the waveform or the codec parameter domain. However, PLC approaches may be inadequate for applications experiencing packet loss greater than 1%. In speech and audio applications, the pseudo-stationary property of the audio signals on the order of 20-40 millisecond may also limit the gap in which extrapolation may be successfully used. In transitional areas, the previous waveform may not represent the current lost gap, resulting in audible and annoying artifacts. In wireless communication systems that use retransmission protocol to combat poor channel conditions, such as Bluetooth, the receiver may receive several copies of the same packet, all corrupted by bit-errors. Discarding the corrupted packets, even when each complete packet only has one bit-error, is also wasteful of information and channel bandwidth.

Methods and systems are disclosed for using softbit decoding techniques in retransmission-based networks for error concealment of information packets corrupted by bit-errors. The softbit decoding techniques derive softbit information from multiple corrupted hardbits of the retransmitted packet to aid a receiver in decoding the packet. The approach enables the realization of improved error concealment capability of softbit decoding over PLC while maintaining a simple system architecture that has kept PLC in use. In one application, softbit decoding of retransmissions of compressed audio packets is used to facilitate the decoding of audio packets received over retransmission-based networks such as Bluetooth.

The claimed subject matter may include any combination of the various aspects, embodiments, and/or portions of embodiments described herein, for example: in one aspect, a retransmission softbit module is inserted between a channel decoder used for channel-decoding and demodulating a compressed packet and a softbit decoder. The retransmission softbit module may derive reliability information for each bit of a packet from multiple corrupted copies of the transmitted packet received from the channel decoder. The retransmit softbit module may accumulate hardbits of the multiple copies of the packet on a bit level to derive an accumulated softbit packet. From the accumulated soft bit packet, a majority decision packet (MDP) may be created using a majority voting scheme. A tie in the number of received 0's and 1's may be resolved by an arbitrary bit setting. The retransmission softbit module may compute the CRC of the MDP to determine if there are any bit-errors in the MDP. If the CRC passes, indicating an error-free MDP, the reliability information for each bit of the packet may be set to a maximum. Otherwise, the retransmission softbit module may compute the reliability information for each bit based on the accumulated softbit packet or the MDP. The reliability information and the MDP may be provided to the softbit decoder for decoding, also referred to as synthesizing, a packet from the compressed packet represented by the MDP.

In one aspect, to determine the bit reliability information, the retransmission softbit module may compute the probability that a bit of the MDP, or a best-guess estimate of the bit as determined from the accumulated softbit packet, is equal to the bit in the transmitted packet. The retransmission softbit module may also compute the probability that the bit of the MDP, or a best-guess estimate of the bit as determined from the accumulated softbit packet, is not equal to the bit in the transmitted packet. The bit reliability information or conversely the bit error information for the given bit may be computed based on a ratio of the two probabilities. In one aspect, if an estimate of the number of actual bit-errors in the packet is available, the bit reliability information may be normalized such that the expected number of bit-errors in the packet is equal to the estimate. In one aspect, the retransmission softbit module may compute the reliability information or the error information for each bit of the packet based on a BER of the channel. In one aspect, the BER may be expected to be different for each retransmission of the packet, such as in a fading channel, and the BER may be estimated separately for each retransmission of the packet to compute the bit reliability information of the packet. In one aspect, the BER may be assumed to be constant across all retransmissions, such as in an additive white Gaussian noise (AWGN) channel, and a single BER may be estimated for all retransmissions of the packet to compute the bit reliability information of the packet. In one aspect, the BER may be estimated by comparing the MDP, or a best-guess estimate of the transmitted packet as determined from the accumulated softbit packet, with the multiple corrupted copies of the transmitted packet from the channel decoder.

While aspects of the subject technology are described in the context of BLE, it is understood that the subject technology is applicable to other wireless networks including but not limited to cellular networks (e.g., Long-Term Evolution (LTE) networks), wireless local area networks (WLANs), wireless sensor networks and satellite communication networks.

FIG. 1 illustrates an example network architecture 100, in accordance with some embodiments of the present disclosure. As shown in FIG. 1, the network architecture 100 may include a transmitter 111 and a receiver 112. The transmitter 111 may transmit wireless radio-frequency signals carrying data packets (or data messages, frames, etc.) to the receiver 112, as indicated by arrow 103. The receiver 112 may receive the transmitted signals to extract the data packets. If the receiver 112 detects that a transmitted data packet is correctly received without bit errors, the receiver 112 may send a notification such as an acknowledgement (ACK) to the transmitter 111. The transmitter 111 will not retransmit the correctly received data packet. On the other hand, if the receiver 112 detects that a received data packet is a corrupted data packet including one or more bit errors, the receiver 112 may send a notification such as a negative acknowledgement (NACK) to the transmitter 111. The transmitter 111 will retransmit the data packet to the receiver 112. The circle 110 illustrated in FIG. 1 may represent the range of the radio-frequency signals transmitted by the transmitter 111. Receivers such as the receiver 112 that are located within the circle 110 may be able to receive radio-frequency signals transmitted by the transmitter 111.

In one embodiment, the network architecture 100 may be a Bluetooth® network. A Bluetooth® network may be a wireless network that includes network devices which communicate using radio frequencies, protocols, standards, data formats, etc., that have been defined by the Bluetooth® Special Interest Group (Bluetooth® SIG). In this embodiment, the transmitter 111 may be a Bluetooth® transmitter and the receiver 112 may be a Bluetooth® receiver. The data packets transmitted from the transmitter 111 to the receiver 112 may be Bluetooth® packets. A Bluetooth® network may rely on retransmissions to combat poor channel conditions. For example, Bluetooth® Classic eSCO may use a preset number of retransmissions (e.g., 2). Bluetooth® Low Energy (BLE) may use a combination of retransmissions, interleaving, and burst transmissions to carry real-time audio. For example, with Connected Isochronous Streams (CIS), a point-to-point or point-to-multipoint connection exists with acknowledgements to trigger retransmission, while in Broadcast Isochronous Streams (BIS), the audio stream is broadcast with a predefined number of retransmissions. The receiver 112 may receive multiple copies of the same packet, all corrupted by bit-errors. In some embodiments, the receiver 112 may combine the corrupted received packets to reconstruct the original packet using bit error correction (BEC) techniques. The network architecture 100 may also include other nodes, components and/or devices not shown in FIG. 1.

Figure 2:
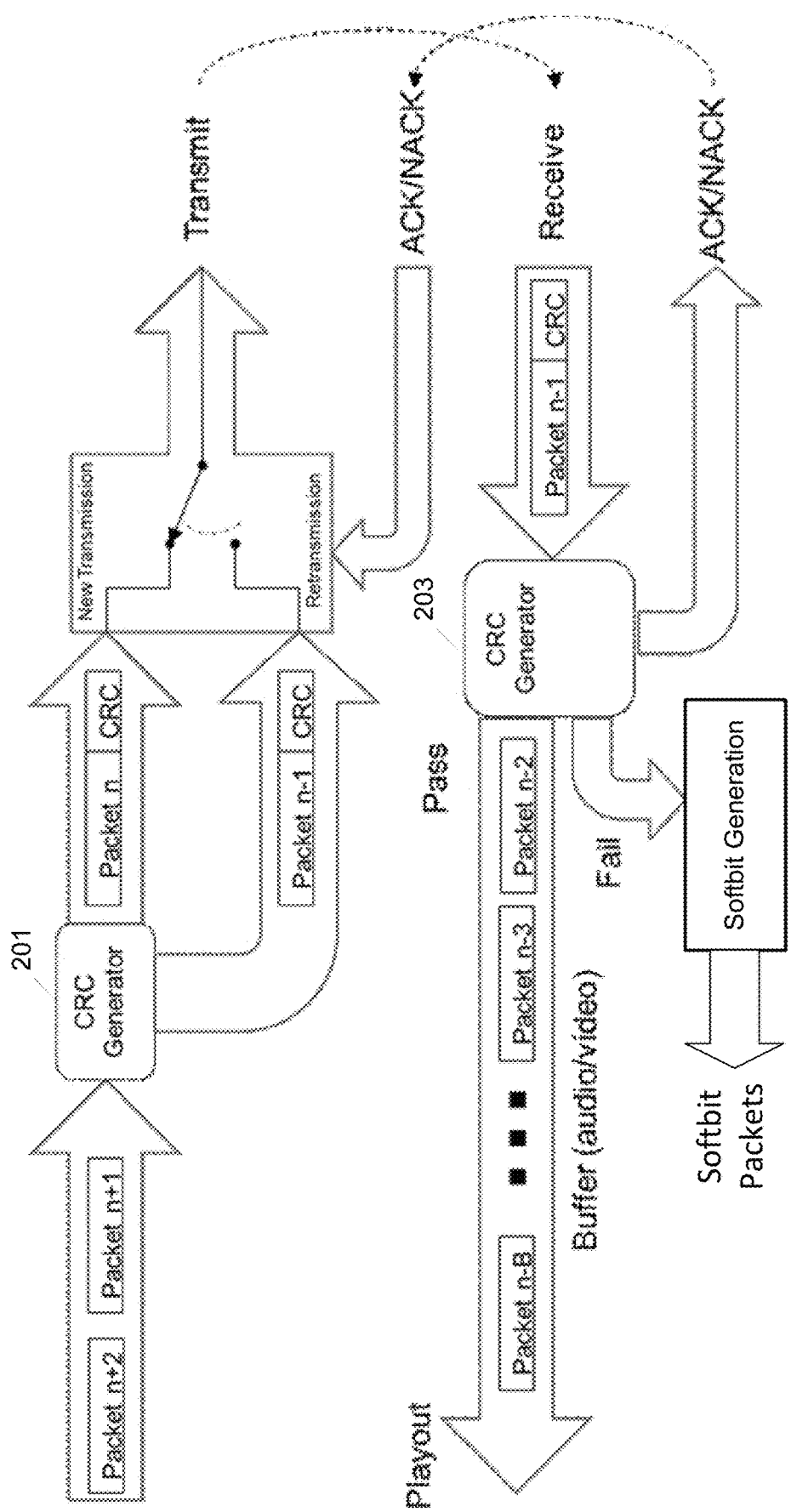
FIG. 2 illustrates an example of a scheme for retransmission to combat bit errors, in accordance with some embodiments of the present disclosure.

FIG. 2 illustrates an example of a scheme for retransmission and buffering to combat bit errors. A CRC generator 201 on the transmitter may compute the CRC checksum for the payload of each packet to be transmitted. The computed CRC checksum may be appended to the payload to form a packet that conforms to the data format of a wireless network and the transmitter may transmit the packet over a channel of the wireless network to a receiver. The packet may be corrupted by random bit errors due to persistent channel impairment or bursty bit errors caused by a transient interfering source or intermittent channel congestion.

A CRC generator 203 on the receiver may receive the packet and may extract the payload to compute the CRC checksum. If the computed CRC checksum matches the received CRC checksum of the packet, the received packet was received without any errors and the receiver may transmit the ACK signal to the transmitter. When the received packet is a compressed packet, such as an encoded audio packet, the received packet may be forwarded to a decoder for decoding. Otherwise, if the computed CRC checksum does not match the received CRC checksum, the packet was corrupted and the receiver may transmit the NACK signal to the transmitter to request retransmission of the packet. Softbit decoding techniques are presented to derive softbit information from multiple corrupted copies of the transmitted packet to aid a receiver in decoding the packet. In one aspect, reliability information for each bit of the packet is derived by accumulating hardbits of the multiple retransmitted packets to facilitate the decoding of the packet.

Figure 3:
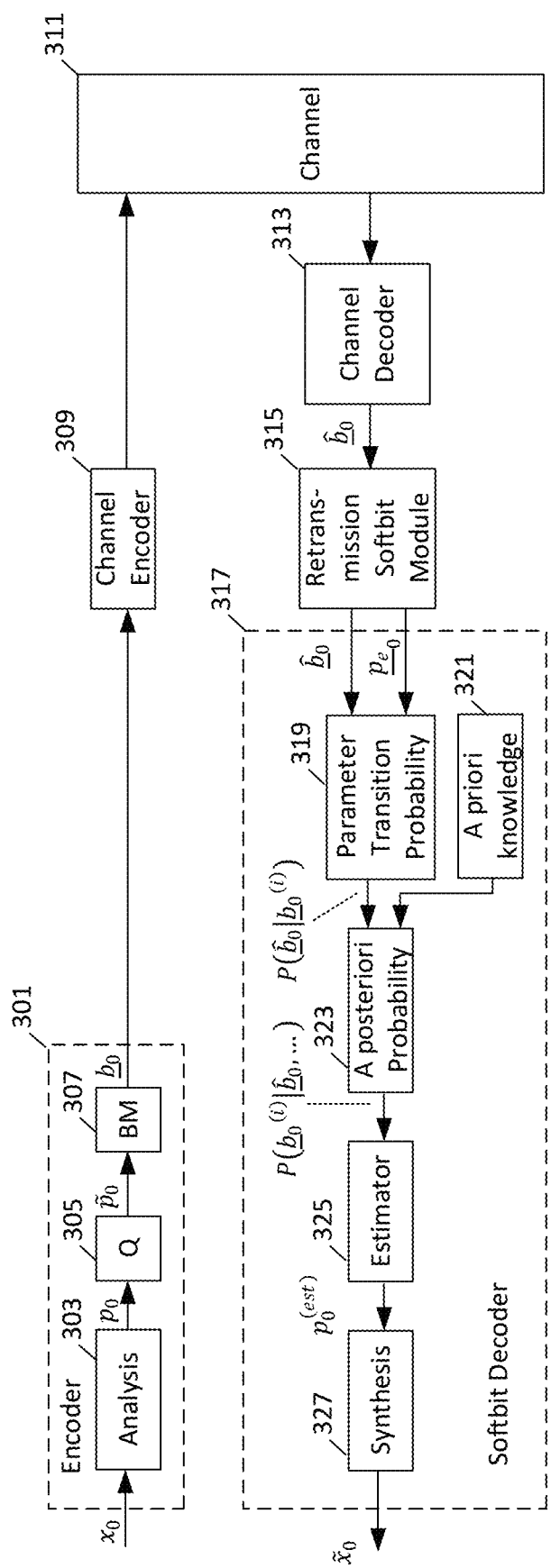
FIG. 3 illustrates an example system block diagram of a softbit decoder with a retransmission softbit module to decode retransmitted speech packets that are used to implement an error concealment technique using softbit decoding, in accordance with some embodiments of the present disclosure.

FIG. 3 illustrates an example system block diagram of a softbit decoder 317 with a retransmission softbit module 315 that are used to decode retransmitted speech packets to implement an error concealment technique using softbit decoding, in accordance with some embodiments of the present disclosure. An audio encoder 301 in a data source such as the Bluetooth® transmitter 111 of FIG. 1 may provide BLE packets or frames including retransmission of corrupted packets or frames through a channel 311. The channel 311 may be modeled as an additive white Gaussian noise (AWGN) channel with BER corresponding to various attenuation scenarios.

The input audio frame $x_0$ at current frame 0 is converted to a set of codec parameters $p_0$ by an analysis module 303 of audio encoder 301 and then quantized by a quantizer 305 to a set of integer indices $\tilde{p}_0$. The indices are bit-mapped by a bitmap module 307 into a bitstream $\underline{b}_0$ of frame 0. In some embodiments, audio encoder 301 may perform pulse-code modulation (PCM) or adaptive differential PCM (ADPCM) of the input audio frame $x_0$ to generate a frame of encoded or compressed audio data represented by $\underline{b}_0$. A channel encoder 309 may perform channel encoding and modulation of $\underline{b}_0$ of the frame before the frame of compressed audio data is transmitted across the channel 311.

At a receiver such as the Bluetooth® receiver 112 of FIG. 1, a channel decoder 313 may demodulate and channel-decode the received frame into a received bitstream $\hat{\underline{b}}_0$. The received bitstream $\hat{\underline{b}}_0$ may represent hardbits of multiple corrupted copies of the transmitted bitstream $\underline{b}_0$ of frame 0 due to retransmissions. The retransmission softbit module 315 may accumulate the hardbits of the multiple corrupted copies of frame 0 on a bit level to derive an accumulated softbit packet. In some embodiments, the retransmission softbit module 315 may determine a majority decision packet (MDP) based on the accumulated softbit packet using a majority voting scheme. The retransmission softbit module 315 may compute a CRC of the MDP to determine if there are any bit-errors in the MDP. If the CRC passes, indicating an error-free MDP, the reliability information for each bit of the MDP may be set to a maximum value (e.g., 1). Otherwise, the retransmission softbit module 315 may compute the reliability information for each bit based on the accumulated softbit packet or the MDP.

Figure 4:
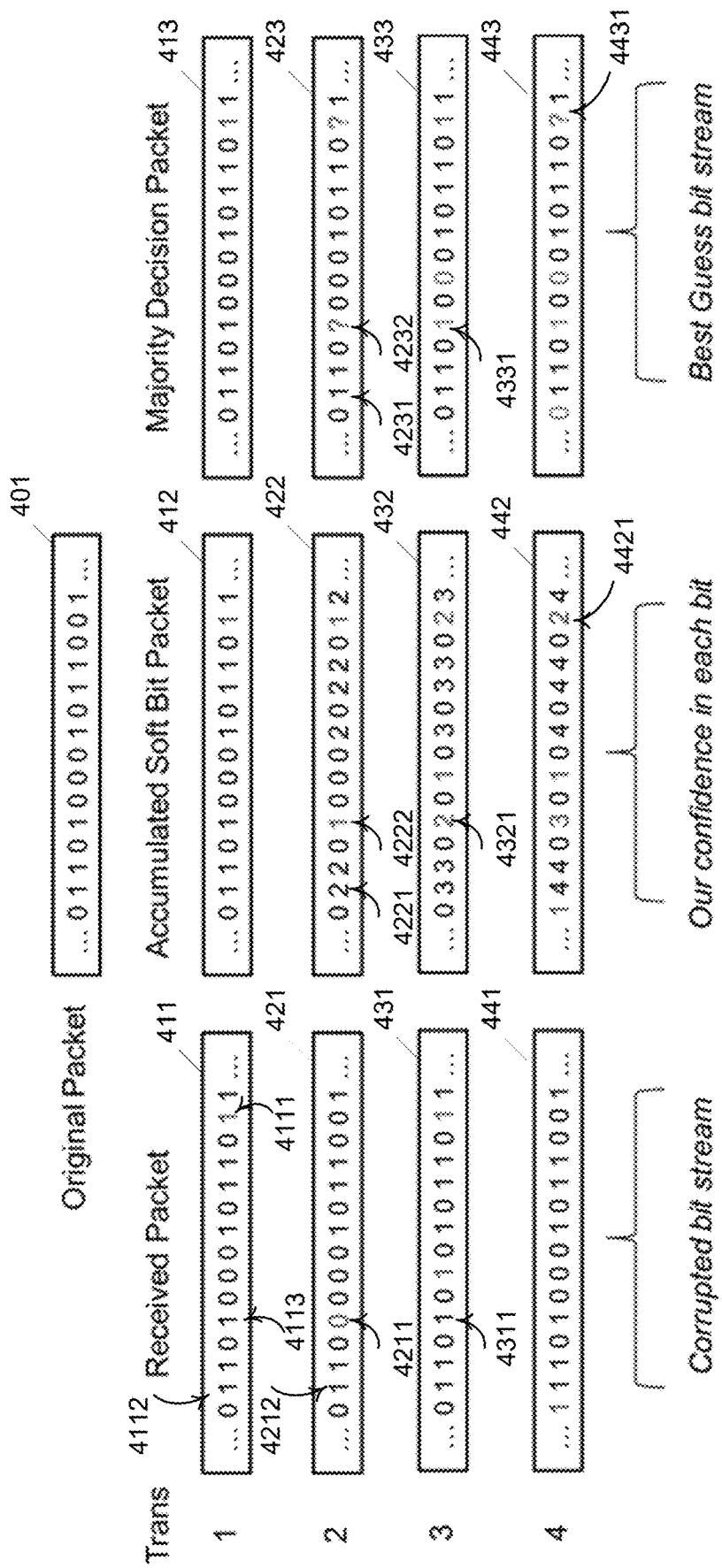
FIG. 4 illustrates an example generation of accumulated soft bit packets and creation of a majority decision packet by a retransmission softbit module operating on retransmissions of corrupted packets, in accordance with some embodiments of the present disclosure.

FIG. 4 illustrates an example generation of accumulated soft bit packets and creation of a MDP by the retransmission softbit module 315 operating on retransmissions of corrupted packets, in accordance with some embodiments of the present disclosure. An original BLE packet 401 may represent a frame of originally transmitted data, such as bitstream $\underline{b}_0$ of frame 0 from the encoder 301 of FIG. 3. The retransmission softbit module 315 may receive a packet 411, such as received bitstream $\hat{\underline{b}}_0$ of frame 0 of FIG. 3, and may perform a CRC to determine whether the packet 411 is a correctly received packet of the original packet 401 without bit errors. In one embodiment, if the packet 411 passes the CRC, the packet 411 is an error-free frame of received bitstream $\hat{\underline{b}}_0$ and may be used for softbit decoding by the softbit decoder 317 with the reliability information for each bit of the packet 411 set to the maximum value (e.g., 1). The retransmission softbit module 315 may send an acknowledgement to the transmitter 111 to stop any retransmission of the original packet 401. In one embodiment, the packet 411 may be a corrupted packet including one or more bit errors such as a bit error 4111. Thus, the CRC will fail. The retransmission softbit module 315 may generate an accumulated packet 412 and a MDP 413 based on the packet 411. When the retransmission softbit module 315 only receives the packet 411, the accumulated packet 412 and the MDP 413 may be the same as the received packet 411.

Because the packet 411 is a corrupted packet of the original packet 401, the retransmission softbit module 315 may request retransmission of the original packet 401. The retransmission softbit module 315 may receive a retransmitted packet 421 of the original packet 401. The retransmission softbit module 315 may perform a CRC to determine whether the received retransmitted packet 421 is correct. In one embodiment, as discussed with the packet 411, if the packet 421 passes the CRC, the packet 421 may be used for softbit decoding by the softbit decoder 317 with the reliability information for each bit of the packet 421 set to the maximum value (e.g., 1). The retransmission softbit module 315 may send an acknowledgement to the transmitter 111 to stop any further retransmission of the original packet 401. In one embodiment, the received retransmitted packet 421 may be a corrupted packet including one or more bit errors such as a bit error 4211. The retransmission softbit module 315 may generate an accumulated packet 422 including soft bits based on the packet 411 and the retransmitted packet 421.

In one aspect, the retransmission softbit module 315 may generate the accumulated packet 422 by performing bitwise decimal addition on the corrupted packet 411 and the received retransmitted packet 421 to generate soft bits in the accumulated packet 422. For example, as shown in FIG. 4, the packet 411 may include a bit stream "0 1 1 0 1 0 0 0 1 0 1 1 0 1 1," and at the corresponding bit locations, the retransmitted packet 421 may include a bit stream "0 1 1 0 0 0 0 0 1 0 1 1 0 0 1." The retransmission softbit module 315 may add the bits in the packet 411 and the corresponding bit in the retransmitted packet 421 to generate the accumulated packet 422 to include a soft bit stream "0 2 2 0 1 0 0 0 2 0 2 2 0 1 2," as shown in FIG. 4. In this example, the bit 4112 in the packet 411 is 1 and the bit 4212 at the corresponding bit location in the retransmitted packet 421 is also 1, thus, the soft bit 4221 at the corresponding bit location in the accumulated packet 422 has a value of 2 (i.e., 1+1).

In one aspect, the retransmission softbit module 315 may compare the corrupted packet 411 and the received retransmitted packet 421 to identify bit locations with different bit values. The identified bit locations may indicate possible bit errors. In one aspect, the retransmission softbit module 315 may accumulate possible bit errors across multiple received copies of the original packet 401 to calculate a BER of the channel. In one aspect, the BER may be used to determine the reliability information of each bit of the packet passed to the softbit decoder 317 to aid the softbit decoder 317 in performing softbit decoding of the packet.

In one aspect, the retransmission softbit module 315 may generate a MDP 423 based on the accumulated packet 422. The MDP 423 may be used as a guess of the original packet 401. Each of the soft bits in the accumulated packet 422 may indicate a confidence level of a corresponding bit in the MDP 423. For example, in the first transmission, bit 4112 is 1 and in the second transmission (the first retransmission), bit 4212 at that bit location is also 1. Thus, it has a higher probability that the correct bit at that bit location is 1 instead of 0 because in two transmissions (one original transmission and one retransmission) the bit values at that bit location are the same. Therefore, the soft bit 4221 having a value of 2 may indicate that it has a higher confidence level that the correct bit at that bit location is 1. Accordingly, the retransmission softbit module 315 may determine that, in the MDP 423, the bit 4231 (a guess of the correct bit) at that bit location is 1. In one aspect, the confidence level of a bit may represent the reliability information of the bit. Thus, the reliability information of bit 4231 may indicate high reliability.

On the other hand, in the first transmission, bit 4113 is 1 and in the second transmission (the first retransmission), bit 4211 at that bit location is 0. Thus, at that bit location, it is not sure whether the correct bit at that location is 1 or 0 because in two transmissions the bit values at that bit location are different. Therefore, the soft bit 4222 having a value of 1 may indicate that the retransmission softbit module 315 is not sure whether the correct bit at that location is 1 or 0. Accordingly, the retransmission softbit module 315 may determine that, in the MDP 423, the bit 4232 (a guess of the correct bit) at that bit location may be either 1 or 0, as indicated by "?". The retransmission softbit module 315 may set the bit 4232 in the MDP 423 as either 1 or 0 as a guess of that bit. The confidence level for bit 4232 may be low and the reliability information of bit 4232 may indicate low reliability.

In one aspect, the retransmission softbit module 315 may compare the corrupted packet 421 to the MDP 423 to identify bit locations with different bit values. The identified bit locations may indicate possible bit errors. In one aspect, the retransmission softbit module 315 may compare each received packet of the retransmission of the original packet 401 with the MDP generated based on the accumulated softbit packet accumulating the original transmission and all retransmissions up to the received packet to identify possible bit errors in the received packet. The retransmission softbit module 315 may accumulate the number of possible bit errors across all received copies of the original packet 401 to calculate a BER of the channel. In one aspect, the BER may be used to determine the reliability information of each bit of the packet, such as a MDP, passed to the softbit decoder 317 to aid the softbit decoder 317 in performing softbit decoding of the packet.

In one aspect, the retransmission softbit module 315 may compute a CRC of the MDP 423 to determine if there are any bit-errors in the MDP. If the CRC passes, indicating an error-free MDP, the reliability information for each bit of the MDP may be set to a maximum value (e.g., 1). If the CRC fails, the retransmission softbit module 315 may request an additional retransmission of the original packet 401, if available, to collect more useful information to determine the locations of bit errors in the received corrupted packets. For example, the retransmission softbit module 315 may request a second retransmission of the original packet 401 and may receive a retransmitted packet 431 that may include one or more bit errors. The retransmission softbit module 315 may generate an accumulated packet 432 based on the packet 411, the received retransmitted packets 421 and 431. The retransmission softbit module 315 may generate the accumulated packet 432 by performing bitwise decimal addition on the packet 411 and the received retransmitted packets 421 and 431, similarly as described above. For example, the bit 4311 in the packet 431 is 1. Thus, the soft bit 4321 at the corresponding bit location in the accumulated packet 432 has a value of 2 (i.e., 1+0+1).

The retransmission softbit module 315 may generate a MDP 433 based on the accumulated packet 432, similarly as described above. The MDP 433 may be used as a guess of the original packet 401. For example, the soft bit 4321 having a value of 2 may indicate that it has a higher confidence level that the correct bit at that bit location is 1.

This is because in three transmissions (one original transmission and two retransmissions), two (i.e., bits 4113 and 4311) of the three bit values at that bit location are 1. Accordingly, the retransmission softbit module 315 may determine that, in the MDP 433, the bit 4331 (a guess of the correct bit) at that bit location is 1.

Similarly, the retransmission softbit module 315 may request a third retransmission and receive a retransmitted packet 441 that may include one or more bit errors. The retransmission softbit module 315 may generate an accumulated packet 442 based on the four received corrupted packets (411, 421, 431 and 441). Also, the retransmission softbit module 315 may generate a MDP 443 based on the accumulated packet 442. The MDP 443 may be used as a best guess of the original packet 401. For example, the soft bit 4421 having a value of 2 may indicate that the retransmission softbit module 315 is not sure whether the correct bit at that location is 1 or 0. This is because in four transmissions (one original transmission and three retransmissions), two of the four bit values at that bit location are 1. Accordingly, the retransmission softbit module 315 may determine that, in the MDP 443, the bit 4431 (a guess of the correct bit) at that bit location may be either 1 or 0, as indicated by "?". The retransmission softbit module 315 may set the bit 4431 in the MDP 443 as either 1 or 0 as a guess of that bit. The confidence level for bit 4431 may be low and the reliability information of bit 4431 may indicate low reliability.

In one aspect, for a number of N total transmissions (1 original transmission+(N−1) retransmissions), when N is an even number, if a value of a soft bit in an accumulated packet is higher than $$\frac{N}{2},$$

the corresponding on in me generated MDP is 1; if the value of the soft bit is equal to $$\frac{N}{2},$$

the corresponding bit in the generated MDP can be either 1 or 0; if the value of the soft bit is less than $$\frac{N}{2},$$

the corresponding bit in the generated MDP is 0. For example, as shown in FIG. 4, when there are 4 total transmissions of the original packet 401, if the soft bit in the accumulated packet 442 has a value of 3 or 4, the corresponding bit in the generated MDP 443 is 1; if the soft bit in the accumulated packet 442 has a value of 2, the corresponding bit in the generated MDP 443 can be either 1 or 0 as indicated by "?" for bit 4431; if the soft bit in the accumulated packet 442 has a value of 0 or 1, the corresponding bit in the generated MDP 443 is 0. In another example, when N is an odd number, if a value of a soft bit in an accumulated packet is equal or higher than $$\frac{N+1}{2},$$

the corresponding bit in the generated MDP is 1; otherwise, the corresponding bit in the generated MDP is 0.

After the MDP is generated, the CRC is computed to determine if any errors remain. Assuming the BER is independent of bit position, the probability that a bit-error falls in the same location is exceedingly small and decreases with each retransmission. Hence, the ability to resolve errors increases with increasing number of retransmissions. Using the accumulated softbit packets to determine a best guess of the original packet reduces the packet error rate. However, in audio applications with its low delay requirements, the total number of retransmissions may be limited, resulting in a non-zero residual packet error rate. The accumulated softbit packet may provide a way to estimate the bit reliability information for each bit in the MDP.

Referring back to FIG. 3, in one aspect, to determine the reliability information $p_{e_0}$ for a bit of the received bitstream $\hat{b}_0$ from the multiple transmissions of the bitstream $\underline{b}_0$, the retransmission softbit module 315 may compute the probability that the bit in the MDP, or a best-guess estimate of bit as determined from the accumulated softbit packet, is equal to the bit in the transmitted packet $\underline{b}_0$. The retransmission softbit module may also compute the probability that the bit of the MDP, or a best-guess estimate of the bit as determined from the accumulated softbit packet, is not equal to the bit in the transmitted packet $\underline{b}_0$. The bit reliability information, or the bit error information $p_{e_0}$, for the bit may be computed based on a ratio of the two probabilities normalized to the range between 0 and 1.

In one aspect, to determine the probability that the best-guess estimate of a bit as determined from the accumulated softbit packet is equal to the bit in the transmitted packet, the retransmission softbit module 315 may compute how close the softbit in the accumulated softbit packet approaches 0 or the maximum value (e.g., N, the total number of transmissions of the original packet) depending on whether the bit is determined to be 0 or 1. In one embodiment, for the 4 transmissions of the origin packet 401 in FIG. 4, if the bit is estimated to be 1 (e.g., softbit is higher than 2), the retransmission softbit module 315 may compute the probability that the transmitted bit is 1 as a ratio of the softbit of the accumulated softbit packet 442 with the value 4. For example, for a softbit of 3, the probability that the transmitted bit is 1 is estimated to be ¾. For a softbit of 4, the probability that the transmitted bit is 1 is estimated to be 1. If the bit is estimated to be 0 (e.g., softbit is less than 2), the retransmission softbit module 315 may compute the probability that the transmitted bit is 0 as the difference between 1 and a ratio of the softbit with the value 4. For example, for a softbit of 1, the probability that the transmitted bit is 0 is estimated to be (1−¼)=¾. For a softbit of 0, the probability that the transmitted bit is 0 is estimated to be (1−0/4)=1. For a softbit of 2 (e.g., the soft bit 4421), the bit may be estimated to be either 1 or 0, and the probability that the transmitted bit is equal to the estimated value is ½. The probability that the transmitted bit is not equal to the estimated value is computed as 1 minus the probability that the transmitted bit is equal to the estimated value. The bit reliability information, or the bit error information $p_{e_0}$, for the bit may be computed based on a ratio of the probability that the estimated value is equal to the transmitted bit and the probability that the estimated value is not equal to the transmitted bit, with the ratio normalized to the range between 0 and 1.

In one aspect, to determine the probability that a bit in the MDP is equal or not equal to the bit in the transmitted packet in order to compute the reliability information for the bit, the retransmission softbit module 315 may compute a bit-error rate (BER) of the channel. Let RP be a received packet, AP be the accumulated soft bit packet, and MDP be the majority decision packet. Also, let $\overline{X}^i$ be the received packet of transmission i of packet type X and $X^i(k)$ be the $k^{th}$ bit of packet i. In the first step, the BER may be estimated. In one aspect, for an AWGN channel, the error rate is assumed to be constant across all received packets. The BER estimate for a transmission j of the packet may be computed as:

$$BER^j = \frac{\sum_{i=1}^{N} \sum_{k=1}^{B} x^i(k) \oplus MDP^N(k)}{N \cdot B}, \ j = 1...N \quad \text{(Equation 1)}$$

where N is the total number of transmissions, $MDP^N$ is the MDP determined from the accumulated softbit packet after N transmissions of the packets and B is the size of the packet in bits.

In one aspect, for a fading channel, the BER is assumed to be different for each transmission $\overline{X}^i$. If the packet size B is large enough to obtain a good estimate of the BER, the BER estimate for each transmission $\overline{X}^i$ may be computed separately as:

$$BER^i = \frac{\sum_{k=1}^{B} x^i(k) \oplus MDP^N(k)}{B}, \ i = 1...N \quad \text{(Equation 2)}$$

Equations 1 and 2 compare each received packet $\overline{X}^i$ with the $MDP^N$ determined from the accumulated softbit packet after receiving N copies of the transmitted packet. Each received packet $\overline{X}^i$ may have to be stored until all transmissions of the transmitted packet have been received. In one aspect, to reduce storage space, the BER may be calculated by comparing each received packet $\overline{X}^i$ with the $MDP^i$ determined from the accumulated softbit packet after receiving packet $\overline{X}^i$. Thus, a running $MDP^i$ based on accumulating hardbits from i transmissions of the packet is compared against the received packet $\overline{X}^i$ to compute the BER.

The retransmission softbit module 315 may compute the probability that the $k^{th}$ bit in the MDP is equal to the $k^{th}$ transmitted bit in the transmitted packet, $\underline{b}_0(k)$ as:

$$P(MDP^N(k) = \underline{b}_0(k)) = \prod_{i=1}^{N} e^i(k) \quad \text{(Equation 3)}$$
$$e^i(k) = 1 - BER^i \ \text{if} \ RP^i(k) == MDP^N(k)$$
$$= BER^i \quad \text{otherwise}$$

The retransmission softbit module 315 may also compute the probability that the $k^{th}$ bit in the MDP is not equal to the $k^{th}$ transmitted bit in the transmitted packet, $\underline{b}_0(k)$ as:

$$P(MDP^N(k) \neq \underline{b}_0(k)) = \prod_{i=1}^{N} e^i(k) \quad \text{(Equation 4)}$$
$$e^i(k) = BER^i \quad \text{if} \ RP^i(k) == MDP^N(k)$$
$$= 1 - BER^i \quad \text{otherwise}$$

The retransmission softbit module 315 may compute bit error information $p_e(k)$ for each bit, k, in the B bit packet $\underline{b}_0(k)$ as:

$$p_e(k) = \frac{1}{1 + \frac{P(MDP^N(k) = \underline{b}_0(k))}{P(MDP^N(k) \neq \underline{b}_0(k))}} \quad \text{(Equation 5)}$$

In one aspect, the softbit module 315 may compute the bit reliability information $p_r(k)$ for each bit, k, in the B bit packet $\underline{b}_0(k)$ as:

$$p_r(k) = \frac{1}{1 + \frac{P(MDP^N(k) \neq \underline{b}_0(k))}{P(MDP^N(k) = \underline{b}_0(k))}} \quad \text{(Equation 6)}$$

In one aspect, if an estimate of the number of actual bit-errors in the received bitstream $\hat{b}_0$ of the packet or in the MDP is available, the bit reliability information or the bit error information may be normalized such that the expected number of bit-errors in the packet is equal to the estimate. In one aspect, the probability that the $k^{th}$ bit in the MDP is equal or not equal to the $k^{th}$ transmitted bit in the transmitted packet may be computed without relying on the BER for the channel or for each transmission. For example, the retransmission softbit module 315 may receive softbit decisions for the bitstream $\hat{b}_0$ from the channel decoder 313 instead of decoded hardbits of the received packet. The retransmission softbit module 315 may compute the probability that the $k^{th}$ bit in the received packet $\overline{X}^i$ is equal to the $k^{th}$ transmitted bit in the transmitted packet by determining the distance between the received softbit decision for the $k^{th}$ bit and the nearest constellation point of the modulation scheme used. The longer such distance is, the smaller the probability that the $k^{th}$ transmitted bit is modulated using that constellation point. Based on the computed probabilities for the $k^{th}$ bit of each received packet $\overline{X}^i$, the retransmission softbit module 315 may use equations similar to Equations 3 and 4 to compute the probability that the $k^{th}$ bit in the MDP is equal or not equal to the $k^{th}$ transmitted bit in the transmitted packet.

In one aspect, the retransmission softbit module 315 may compute the probability that the best-guess estimate of the $k^{th}$ bit in the multiple received packet $\overline{X}^i$ is equal or not equal to the $k^{th}$ transmitted bit in the transmitted packet by using the accumulated softbit packet instead of the MDP. For example, as discussed, the retransmission softbit module 315 may compute the probability that the $k^{th}$ received bit as estimated from the multiple received packets is equal to the $k^{th}$ transmitted bit in the transmitted packet by computing how close the $k^{th}$ bit in the accumulated softbit packet approaches 0 or the maximum value depending whether the $k^{th}$ bit is estimated to be 0 or 1. The probability that the estimated $k^{th}$ bit is not equal to the $k^{th}$ transmitted bit in the transmitted packet may be computed as 1 minus the probability that the estimated $k^{th}$ bit is equal to the $k^{th}$ transmitted bit. The bit error information $p_e(k)$ or the bit reliability information $p_r(k)$ for the $k^{th}$ bit may be computed using the ratio of the two probabilities as in Equations 5 and 6. In one aspect, the bit error information $p_e(k)$ or the bit reliability information $p_r(k)$ for each bit k in the B bit packet $\underline{b}_0(k)$ may be computed differently from Equations 5 and 6.

The retransmission softbit module 315 may forward the received packet such as the bitstream $\overline{X}^i_0$ or the MDP and the bit error information $\underline{p_e}_0$ (or the bit reliability information) for the bits in the received packet to the softbit decoder 317 to decode the output audio $\tilde{x}_0$. The bit error information $p_e(k)$ may be combined with the a priori knowledge of the residual redundancy observed within the codec parameters. The softbit decoder 317 may estimate the codec parameters $p_0^{(est)}$ according to appropriate error criteria that reflects perceived audio quality.

In one aspect, a parameter transition probability module 319 may receive the bitstream $\hat{b}_0$ (or the MDP) and the associated bit error information $\underline{p_e}_0$ (or the bit reliability information) from the retransmission softbit module 315 to compute the parameter transition probabilities, e.g., $P(\hat{b}|\underline{b}_0^{(i)})$, $i \in \{0, 1, \ldots, 2^M-1\}$ for each parameter of size M bits, interpreted as the probability of the known received bit combination $\hat{b}_0$ under the assumption of any unknown bit combination $\underline{b}_0^{(i)}$ that might have been transmitted. Due to practical reasons, in most cases residual redundancy may still reside within the codec parameters after quantization.

In one aspect, an a priori knowledge module 321 may derive offline a priori knowledge of bitstream $\underline{b}_0$ of codec parameters $p_0$ based on N previous codec parameters $P(\underline{b}_0|\underline{b}_{-1}, \ldots, \underline{b}_{-N})$ by processing a large audio database through the encoder 301 and storing the results in tables for each parameter. The order N is parameter dependent based on the amount of redundancy, and the system budget for decoding complexity and table storage. In one aspect, for N=0, an a posteriori probability module 323 may use Bayes rule to combine the parameter transition probability $P(\hat{b}_0|\underline{b}_0^{(i)})$ and the a priori knowledge $P(\underline{b}_0|\underline{b}_{-1}, \ldots, \underline{b}_{-N})$ to yield the $2^M$ a posteriori probability $P(\underline{b}_0^{(i)}|\hat{b}_0, \ldots)$, $i \in \{0, 1, \ldots, 2^M-1\}$ for an M-bit parameter.

In one aspect, an estimator module 325 may estimate the optimal parameter values $p_0^{(est)}$ using the a posteriori probabilities $P(\underline{b}_0^{(i)}|\hat{b}_0, \ldots)$ for the parameter. For audio application, the estimator module 325 may use a maximum a posteriori (MAP) estimator or a minimum mean square (MS) estimator. The MAP estimator $\tilde{p}_0^{(MAP)} = \tilde{p}_0^{(k)}$, $$k = \underset{i}{\mathrm{argmax}} P(\underline{b}_0^{(i)}|\hat{b}_0, \ldots)$$

minimizes the probability of an incorrectly decoded parameter based on the a posteriori probability. The MS estimator $\tilde{p}_0^{(MS)} = \sum_{i=0}^{2^M} \tilde{p}_0^{(i)} \cdot P(\underline{b}_0^{(i)}|\hat{b}_0, \ldots)$ obtains an estimate in the minimum mean square error sense. Either estimate (or another) may be used to minimize audio distortion on a parameter by parameter basis. In one aspect, the estimator module 325 may adaptively modify the parameter estimation algorithm based on the bit error information $\underline{p_e}_0$ (or the bit reliability information) of the bitstream $\hat{b}_0$ (or the MDP) of the received parameters. A synthesis module 327 may synthesize the output audio $\tilde{x}_0$ based on the estimated parameter $p_0^{(est)}$.

Advantageously, the technique of using softbit information derived from multiple corrupted hardbits of the retransmitted packet in retransmission-based systems improves error concealment over PLC. The use of the retransmission softbit module 315 between the channel decoder 313 and the softbit decoder 317 also maintains a simple system architecture traditionally associated with PLC.

Figure 5:
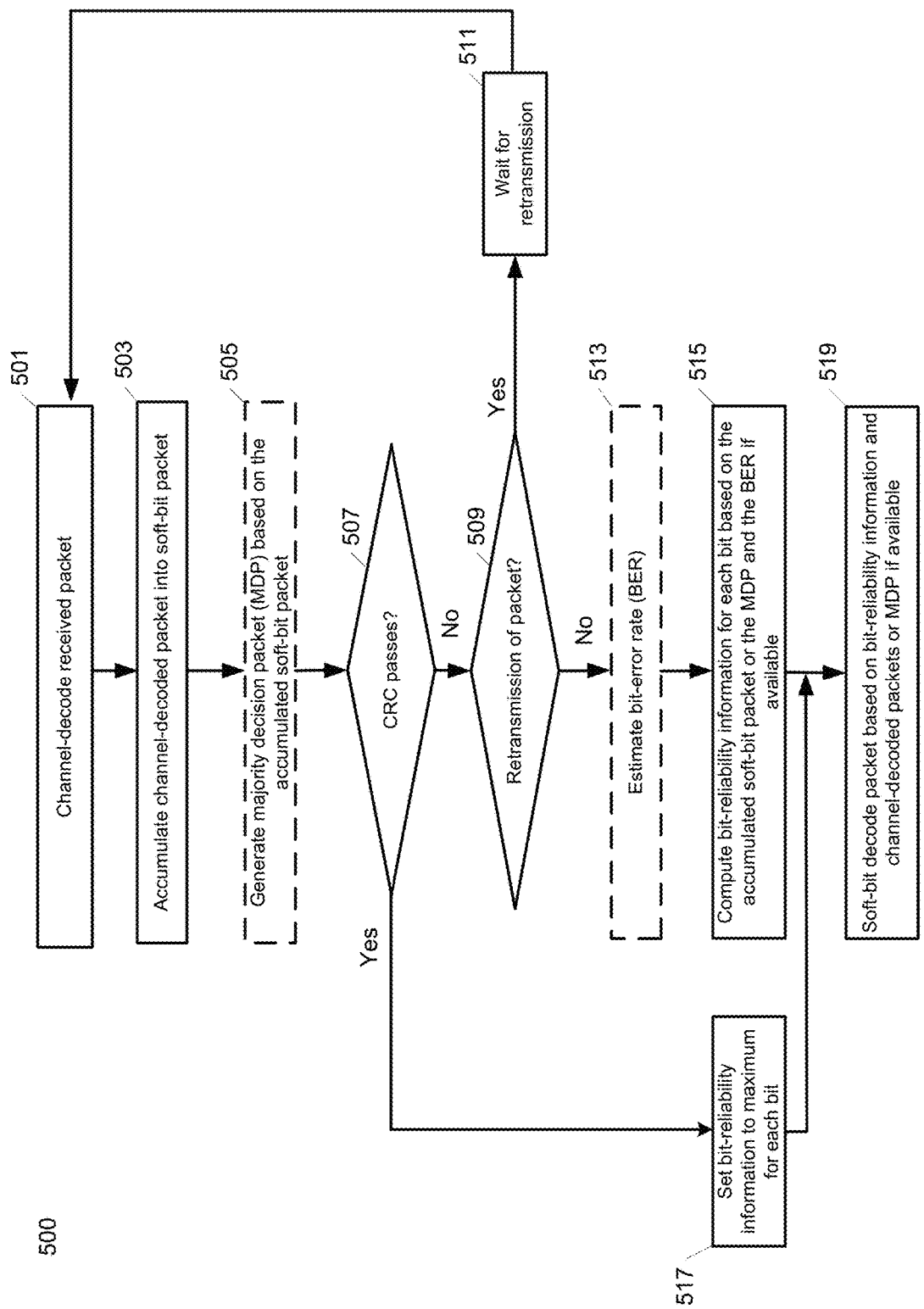
FIG. 5 illustrates a flow diagram of a method for a softbit decoder and a retransmission softbit module to process retransmitted packets to decode packet data using an error concealment technique based on softbit decoding, in accordance with some embodiments of the present disclosure.

FIG. 5 illustrates a flow diagram of a method 500 for a softbit decoder and a retransmission softbit module to process retransmitted packets to decode packet data using an error concealment technique based on softbit decoding, in accordance with some embodiments of the present disclosure. Method 500 may be performed by processing logic that may include hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 500 may be performed by the retransmission softbit module 315 and the softbit decoder 317 of FIG. 3.

At operation 501, the method 500 demodulates and channel-decodes a packet of received data to generate a channel-decoded packet. The channel-decoded packet may represent hardbits (binary) of an initial transmission or a retransmission of a packet that has been corrupted by noise. In one aspect, the channel-decoded packet may be an encoded or compressed BLE frame of audio or speech signals received over a BLE channel. A channel decoder 313 of FIG. 313 may perform operation 501.

At operation 503, a retransmission softbit module accumulates the hardbits of the channel-decoded packet into an accumulated softbit packet. The accumulated softbit packet may accumulate in a bitwise fashion the hardbits of the channel-decoded packet with any previously received copy of the same transmitted packet.

At operation 505, the retransmission softbit module may optionally generate a majority decision packet (MDP) based on the accumulated softbit packet using a majority voting scheme. The MDP may represent a best guess of the transmit packet. In one aspect, for a number of N total transmissions (1 original transmission+(N−1) retransmissions) of the transmit packet accumulated by the accumulated softbit packet, when N is an even number, if a value of a soft bit in the accumulated softbit packet is higher than $$\frac{N}{2},$$

the corresponding bit in the generated MDP is 1; if the value of the soft bit is equal to $$\frac{N}{2},$$

the corresponding bit in the generated MDP can be either 1 or 0; if the value of the soft bit is less than $$\frac{N}{2},$$

the corresponding bit in the generated MDP is 0. When N is an odd number, if a value of a soft bit in the accumulated softbit packet is equal or higher than $$\frac{N+1}{2},$$

the corresponding bit in me generated MDP is 1; otherwise, the corresponding bit in the generated MDP is 0.

At operation 507, the retransmission softbit module computes a CRC checksum of the MDP, if available, or a best-guess estimate of the transmit packet as determined from the accumulated softbit packet to determine if there are any bit-errors in the MDP or the best-guess estimated packet. If the CRC checksum passes, indicating no bit-errors, the bit reliability information for each bit of the MDP or the best-guess estimated packet is set to a maximum value (e.g., 1) at operation 517. The bit reliability information associated with a bit may represent the confidence level that the bit is the same as what is transmitted in the transmit packet. In one aspect, instead of the bit reliability information, operation 517 may set the bit error information for each bit of the MDP or the best-guess estimated packet to a minimum value (e.g., 0). In one aspect, the retransmission softbit module may compute a CRC checksum on the channel-decoded packet directly. If the CRC checksum passes, indicating an error-free channel-decoded packet, operation 517 may set the bit reliability information for each bit of the channel-decoded packet to a maximum value.

At operation 519, the softbit decoder decodes the channel-decoded packets from the multiple transmissions or the MDP, if available, based on the bit reliability information for each bit. In one aspect, the softbit decoder may combine the bit reliability information with a priori knowledge of the residual redundancy of the parameters in successive frames of the channel-decoded packets to estimate and decode the parameters in the received packets. In one aspect, when the received packet is an encoded frame of audio or speech signals, the softbit decoder may synthesize the codec parameters based on the bit reliability information and a priori knowledge of the residual redundancy of the codec parameters in successive frames of audio or speech signals.

If the CRC checksum in operation 507 fails, the retransmission softbit module determines if a maximum or a preset number of retransmissions of the transmit packet has been received at operation 509. If the maximum or the preset number of retransmissions of the transmit packet has not been received, the method 500 requests a retransmission of the transmit packet.

At operation 511, the method 500 waits for the retransmission of the transmit packet. When the retransmitted packet is received, operations 501, 503, 505, 507, and 509 may be repeated to accumulate the hardbits of the retransmitted packet into the accumulated softbit packet, optionally generate the MDP, and compute the CRC to determine whether to perform softbit decoding of the channel-decoded packets or the MDP or to request additional retransmission of the transmit packet.

At operation 513, if the maximum or the preset number of retransmissions of the transmit packet has been received and the CRC still fails, the retransmission softbit module may optionally estimate the bit-error rate (BER) of the channel. In one aspect, operation 513 may compare the channel-decoded packet with the MDP to identify possible bit errors. Operation 513 may accumulate the possible bit errors across multiple retransmissions of the transmit packet to estimate the BER if the BER is assumed to be constant across the multiple retransmissions such as in an AWGN channel. In one aspect, operation 513 may compute the BER separately for each transmission of the transmit packet if the BER is assumed to be different for each transmission such as in a fading channel.

At operation 515, the retransmission softbit module computes the bit reliability information for each bit based on the accumulated softbit packet or the MDP, if available, and aided by the BER, if available. In one aspect, operation 515 may compute the probability that a best-guess estimate of a bit as determined from the accumulated softbit packet or the bit in the MDP, if available, is equal to the bit in the transmitted packet. Operation 515 may also compute the probability that a best-guess estimate of the bit as determined from the accumulated softbit packet or the bit of the MDP, if available, is not equal to the bit in the transmitted packet. The bit reliability information for the bit may be computed based on a ratio of the two probabilities normalized to the range between 0 and 1. In one aspect, operation 515 may compute the probabilities based on the BER of the channel or the retransmit packet if the BER information is available. In one aspect, operation 515 may compute the probabilities based on the accumulated softbit packet without the use of BER information.

At operation 519, the softbit decoder decodes the channel-decoded packets from the multiple transmissions or the MDP with the aid of the bit reliability information for each bit. In one aspect, as discussed, when the received packet is an encoded frame of audio or speech signals, the softbit decoder may synthesize the codec parameters based on the bit reliability information and a priori knowledge of the residual redundancy of the codec parameters in successive frames of audio or speech signals.

Figure 6:
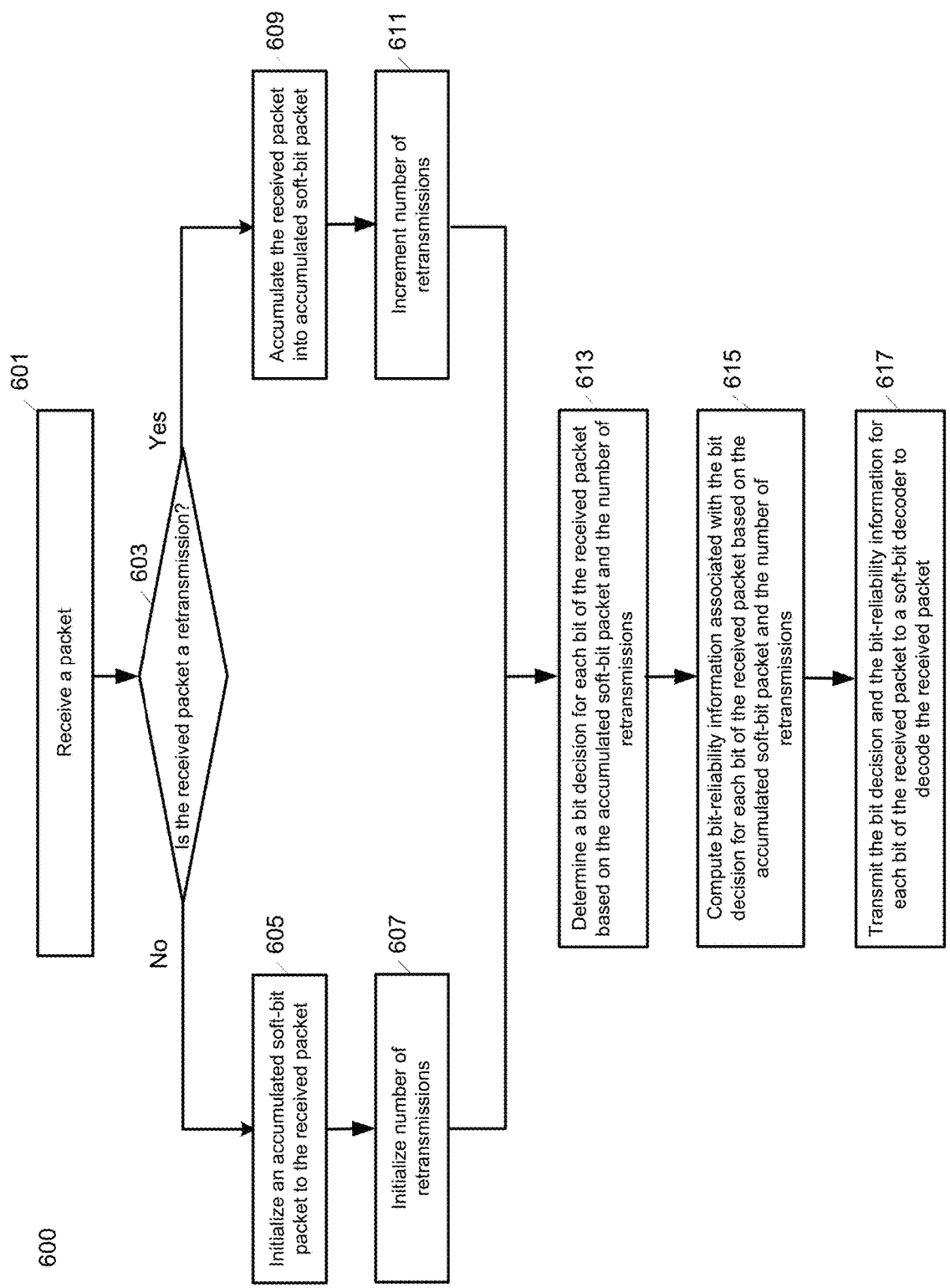
FIG. 6 illustrates a flow diagram of a method for a retransmission softbit module to generate bit decision and bit-reliability information for bits of a retransmitted packet to aid a softbit decoder to decode the retransmitted packet using a softbit decoding technique for error concealment, in accordance with some embodiments of the present disclosure.

FIG. 6 illustrates a flow diagram of a method 600 for a retransmission softbit module to generate bit decision and bit-reliability information for bits of a retransmitted packet to aid a softbit decoder to decode the retransmitted packet using a softbit decoding technique for error concealment, in accordance with some embodiments of the present disclosure. Method 600 may be performed by processing logic that may include hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 600 may be performed by the retransmission softbit module 315 of FIG. 3.

At operation 601, the retransmission softbit module receives a packet. The received packet may represent hardbits (binary) of an initial transmission or a retransmission of a transmit packet that has been corrupted by noise. In one aspect, the received packet may be an encoded or compressed BLE frame of audio or speech signals received over a retransmission-based system.

At operation 603, the retransmission softbit module determines whether the received packet is an initial transmission or a retransmission of a transmit packet. For example, if the received packet is received in response to a transmission request from a receiver, the received packet may be a retransmission of a transmit packet.

At operation 605, if the received packet is an initial transmission, the retransmission softbit module initializes an accumulated softbit packet to the received packet. The accumulated softbit packet may accumulate in a bitwise fashion the hardbits of the multiple transmissions of the transmit packet.

At operation 607, the retransmission softbit module initializes the number of retransmissions to 1 to indicate that the received packet is the initial transmission of a transmit packet. The number of retransmission may keep track of the total number of transmissions of the transmit packet that have been received.

Otherwise, if the received packet is a retransmission of a transmit packet, the retransmission softbit module accumulates the received packet into the accumulated softbit packet at operation 609. The retransmission softbit module may update the accumulated softbit packet by performing a bitwise decimal addition of the hardbits of the received packet with the current values of the accumulated softbit packet.

At operation 611, the retransmission softbit module increments the number of retransmission to keep track of the number of the noise-corrupted transmit packets that have been accumulated into the accumulated softbit packet.

At operation 613, the retransmission softbit module determines a bit decision for each bit of the received packet based on the accumulated softbit packet and the number of retransmissions. In one aspect, the retransmission softbit module may generate a best-guess estimate of the transmit packet based on the accumulated softbit packet and the number of retransmissions. In one aspect, the best-guess estimate may use a majority voting scheme using a decision threshold determined by the number of retransmissions to generate a majority decision packet (MDP).

At operation 615, the retransmission softbit module determines the bit reliability information associated with the bit decision for each bit of the received packet based on the accumulated softbit packet and the number of retransmissions. The bit reliability information associated with the bit decision may represent the confidence level that the bit decision is the same as what is transmitted in the transmit packet. In one aspect, the retransmission softbit module may compute the probability that the bit decision is equal to the bit in the transmit packet and the probability that the bit decision is not equal to the bit in the transmit packet. The bit reliability associated with the bit decision may be computed based on a ratio of the two probabilities normalized to the range between 0 and 1.

At operation 617, the retransmission softbit module transmits the bit decision and the bit reliability information associated with the bit decision for each bit of the received packet to a softbit decoder to decode the received packet.

Figure 7:
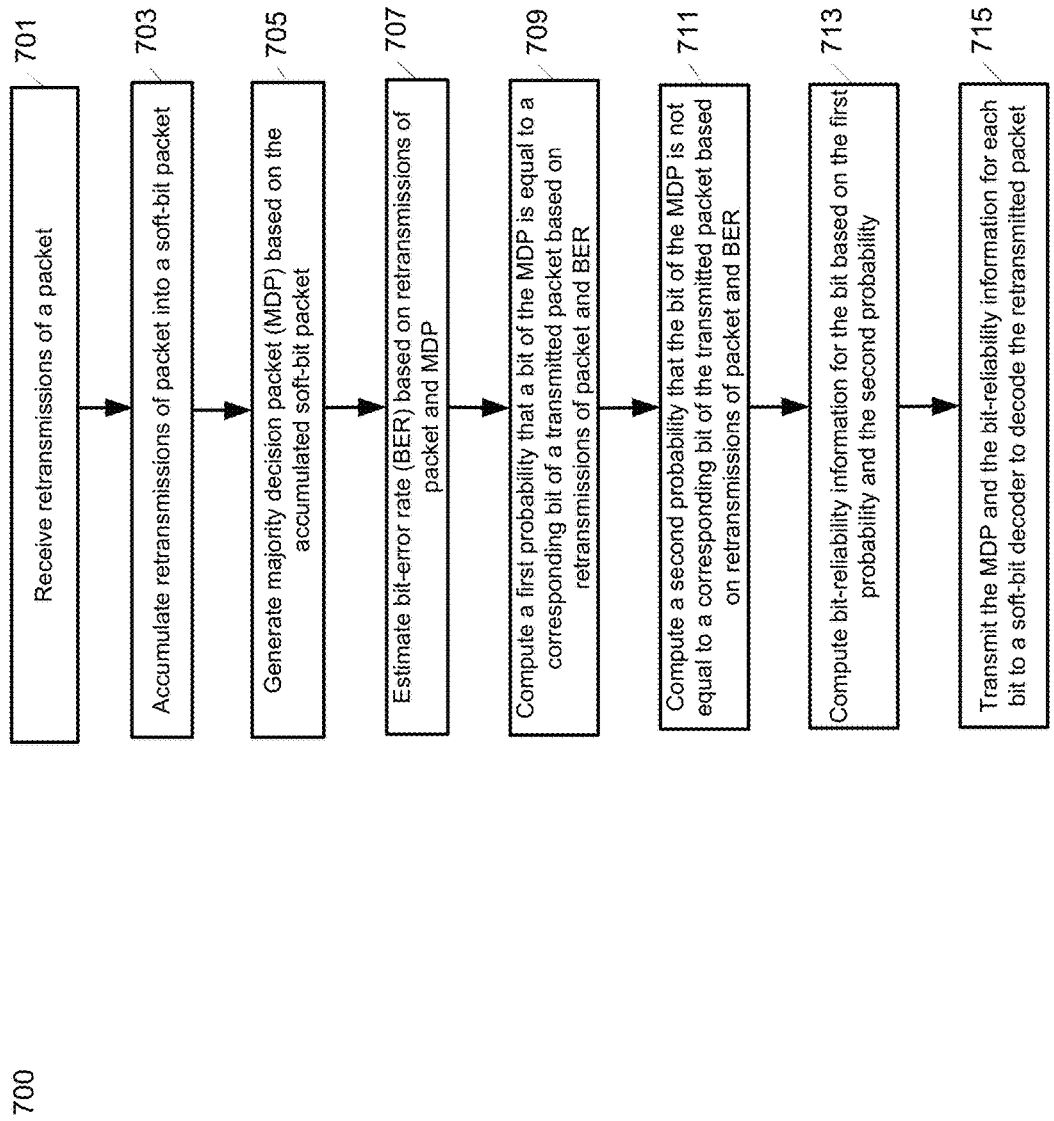
FIG. 7 illustrates a flow diagram of a method for a retransmission softbit module to receive retransmitted packets to accumulate a softbit packet, generate a majority decision packet (MDP), estimate bit error rate, and compute bit reliability information of bits of the MDP to aid a softbit decoder to decode the retransmitted packets using a softbit decoding technique for error concealment, in accordance with some embodiments of the present disclosure.

FIG. 7 illustrates a flow diagram of a method 700 for a retransmission softbit module to receive retransmitted packets to accumulate a softbit packet, generate a MDP, estimate bit error rate, and compute bit reliability information of bits of the MDP to aid a softbit decoder to decode the retransmitted packets using a softbit decoding technique for error concealment, in accordance with some embodiments of the present disclosure. Method 700 may be performed by processing logic that may include hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 700 may be performed by the retransmission softbit module 315 of FIG. 3.

At operation 701, the retransmission softbit module receives one or more retransmitted packets that represent retransmissions of an initial transmit packet. The retransmitted packets may be corrupted by noise. In one aspect, the retransmitted packets may be an encoded or compressed BLE frame of audio or speech signals received over a retransmission-based system.

At operation 703, the retransmission softbit module accumulates the retransmitted packets into an accumulated softbit packet. The retransmission softbit module may perform a bitwise decimal addition of the hardbits of the retransmitted packets to generate the accumulated softbit packet.

At operation 705, the retransmission softbit module generate a MDP based on the accumulated softbit packet using a majority voting scheme. The MDP may represent a best guess of the retransmitted packets. In one aspect, for a number of N total transmissions (1 original transmission+ (N−1) retransmissions) of the retransmitted packets accumulated by the accumulated softbit packet, when N is an even number, if a value of a soft bit in the accumulated softbit packet is higher than $$\frac{N}{2},$$

the corresponding bit in the generated MDP is 1; if the value of the soft bit is equal to $$\frac{N}{2},$$

the corresponding bit in the generated MDP can be either 1 or 0; if the value of the soft bit is less than $$\frac{N}{2},$$

the corresponding bit in the generated MDP is 0. When N is an odd number, if a value of a soft bit in the accumulated softbit packet is equal or higher than $$\frac{N+1}{2},$$

the corresponding bit in the generated MDP is 1; otherwise, the corresponding bit in the generated MDP is 0. The levels of $$\frac{N}{2}$$

when N is even and $$\frac{N+1}{2}$$

when N is odd may be termed the majority decision threshold.

At operation 707, the retransmission softbit module estimates the BER based on the retransmitted packets and the MDP. In one aspect, the retransmission softbit module may compare the retransmitted packets with the MDP to identify possible bit errors. The retransmission softbit module may accumulate the possible bit errors across multiple retransmitted packets to estimate the BER if the BER is assumed to be constant across the multiple retransmitted packets such as in an AWGN channel. In one aspect, the retransmission softbit module may compute the BER separately for each retransmitted packet if the BER is assumed to be different for each retransmitted packet such as in a fading channel.

At operation 709, the retransmission softbit module computes a first probability that a bit of the MDP correctly estimates the bit as transmitted based on the state of the corresponding bit in the retransmitted packets and the BER. In one aspect, assuming the bit in the MDP correctly estimates the transmitted bit, the probability that the corresponding bit in a retransmitted packet is received correctly (i.e., the received bit is equal to the bit in the MDP) is (1−BER) and the probability that the bit in a retransmitted packet is received in error (i.e., it's not equal to the bit in the MDP) is BER. The first probability for the bit may then be computed as the product of the bit probabilities for each of the retransmitted packet depending on whether the corresponding received bit in each retransmitted packet agrees or disagrees with the bit in the MDP.

At operation 711, the retransmission softbit module computes a second probability that the bit of the MDP incorrectly estimates the bit as transmitted based on the state of the corresponding bit in the retransmitted packets and the BER. In one aspect, assuming the bit in the MDP incorrectly estimates the transmitted bit, the probability that the corresponding bit in a retransmitted packet is received correctly (i.e., the received bit is not equal to the bit in the MDP) is (1−BER) and the probability that the bit in a retransmitted packet is received in error (i.e., it's equal to the bit in the MDP) is BER. The second probability for the bit may then be computed as the product of the bit probabilities for each of the retransmitted packet depending on whether the corresponding received bit in each retransmitted packet agrees or disagrees with the bit in the MDP.

At operation 713, the retransmission softbit module computes the bit reliability information associated with the bit based the first probability and the second probability for the bit. In one aspect, the bit reliability information for the bit may be computed as a ratio of the first probability for the bit over a sum of the first probability and the second probability for the bit. In one aspect, the retransmission module may compute the bit error information associated with the bit as a ratio of the second probability for the bit over a sum of the first probability and the second probability for the bit.

At operation 715, the retransmission softbit module transmits the MDP and the bit reliability information associated with each bit of the MDP to a softbit decoder to decode the retransmitted packets using a softbit decoding technique for error concealment.

Figure 8:
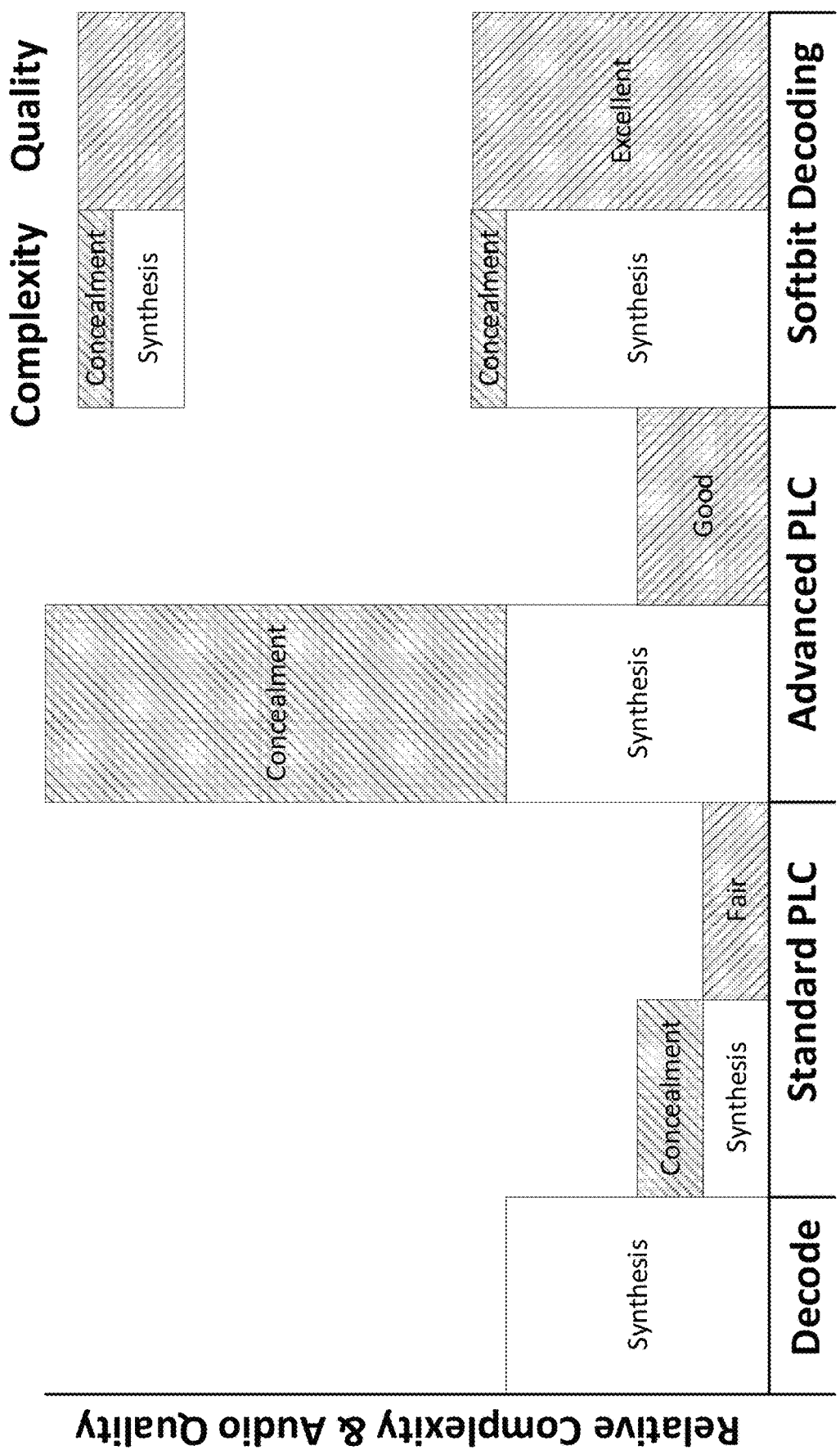
FIG. 8 illustrates an example of the relative complexity and audio quality attributes of error concealment techniques using PLC and softbit decoding approaches, in accordance with some embodiments of the present disclosure.

FIG. 8 illustrates an example of the relative complexity and audio quality attributes of error concealment techniques using PLC and softbit decoding approaches, in accordance with some embodiments of the present disclosure.

As a reference, the complexity profile for the synthesis or decoding of encoded parameters in an audio frame when no error concealment is necessary due to an ideal channel is shown on the far left of the graph. It is desired that the complexity profile of error concealment techniques should remain within this reference decoder profile to ensure an efficient system design. A standard PLC approach that employs simple concealment and synthesis methods such as fading to zero a bad frame or repeating the last correctly decoded frame may yield only fair concealment quality. More advanced PLC approaches may use extrapolation, interpolation (e.g., if future frames are available), statistical, or other techniques in the waveform or the codec parameter domain to provide improved concealment quality. However, the advanced PLC approaches may require significant concealment analysis, resulting in a complexity profile that is significantly greater than that of the reference decoder, and thus is not desirable for an efficient system design.

On the other hand, softbit decoding techniques that use bit reliability information to compute parameter transition probabilities and that estimate the encoded parameters using a posteriori probabilities may have a complexity profile that is a fraction of the reference decoder complexity, while providing excellent concealment quality. The techniques described herein of deriving softbit information from multiple corrupted hardbits copies of the retransmitted packets by a retransmission softbit module between the channel decoder and the softbit decoder also maintains a simple system architecture.

Figure 9:
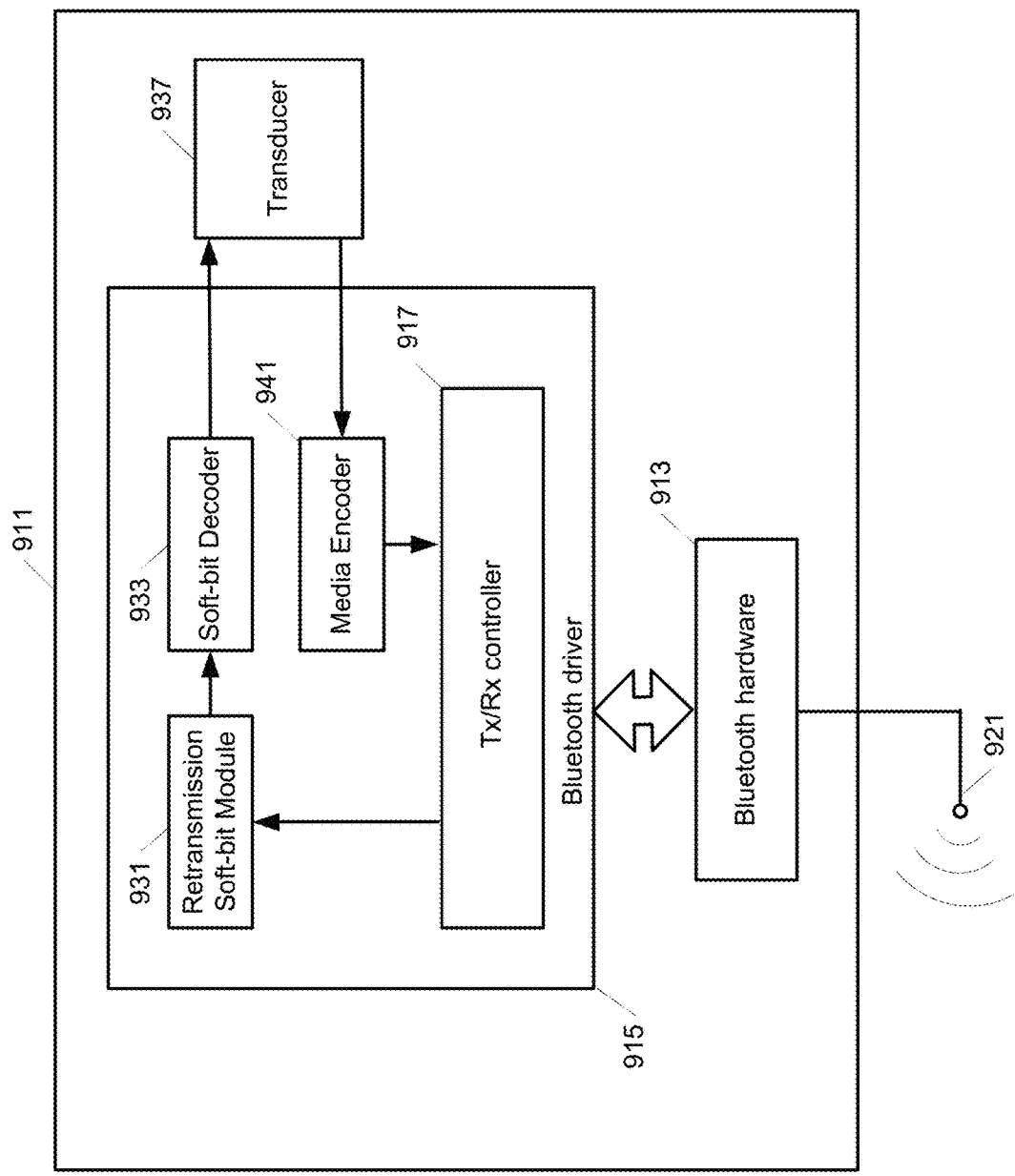
FIG. 9 is a block diagram of a Bluetooth device showing hardware and software drivers deployed to operate in a Bluetooth link to implement error concealment techniques using softbit decoding, in accordance with some embodiments of the present disclosure.

FIG. 9 is a block diagram of a Bluetooth device 911 showing hardware and software drivers deployed to operate in a Bluetooth link to implement error concealment techniques using softbit decoding, in accordance with some embodiments of the present disclosure. The Bluetooth device 911 may be the Bluetooth® receiver 112 of FIG. 1.

The Bluetooth device 911 may include one or more antennas 921, Bluetooth hardware 913, Bluetooth driver 915, and a transducer 937. The Bluetooth driver 915 may include Bluetooth Tx/RX controller 917, retransmission softbit module 931 and softbit decoder 933 in a decoding path, and a media encoder 941 in an encoding path. The Bluetooth hardware 913 may be configured to transmit or receive BLE packets on an operating channel through the antennas 921. The transducer 937 may include speakers to convert electrical audio signals to acoustic audio signals for playback and microphones to capture speech or audio signals.

The Bluetooth Tx/Rx controller 917 may be configured to demodulate and channel-decode received BLE packets and to channel-encode and modulate BLE packets for transmission. The BLE packets may be encoded or compressed frames of audio or speech signals. The retransmission softbit module 931 may be configured to accumulate the hardbits of channel-decoded BLE packets from multiple transmissions of a transmit BLE packet to derive an accumulated softbit packet, to make bit decisions based on the accumulated softbit packet, and to derive reliability information for the bit decisions. The softbit decoder 933 may be configured to implement softbit decoding techniques to decode the encoded audio frames using the bit decisions and reliability information provided by the retransmission softbit module 931. The decoded audio frames may be provided to the speakers of the transducer 937 for audio playback. The media encoder 941 may be configured to implement audio encoding to generate frames of encoded audio data for transmission from audio or speech signals captured by the microphone of the transducer 937.

In one embodiment, the Bluetooth device 911 may include a memory and a processing device. The memory may be synchronous dynamic random access memory (DRAM), read-only memory (ROM)), or other types of memory, which may be configured to store the code to perform the function of the Bluetooth driver 915. The processing device may be provided by one or more general-purpose processing devices such as a microprocessor, central processing unit, or the like. In an illustrative example, processing device may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device may also comprise one or more special-purpose processing devices such as an application specific integrated circuit (ASIC), a field programmable gate array (FPGA), a digital signal processor (DSP), network processor, or the like. The processing device may be configured to execute the operations described herein, in accordance with one or more aspects of the present disclosure, for performing the operations and steps discussed herein. While the softbit decoding techniques as described herein use audio applications as examples to illustrate error concealment approaches in BLE retransmission-based networks, the techniques may be used for error concealment in applications involving video, sensor, text, or other type of information transmitted over wireless or wired networks.

Unless specifically stated otherwise, terms such as "receiving," "generating," "verifying," "performing," "correcting," "identifying," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions. The machine-readable medium may be referred to as a non-transitory machine-readable medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Also, the terms "first," "second," "third," "fourth," etc., as used herein are meant as labels to distinguish among different elements and may not necessarily have an ordinal meaning according to their numerical designation. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method, comprising:
   receiving a plurality of packets over a network, the plurality of packets including an original packet and one or more retransmissions of the original packet, the original packet including a plurality of bits;
   accumulating the plurality of received packets for each bit of the plurality of bits into corresponding accumulated softbits of an accumulated softbit packet;
   determining a bit decision for each bit of the plurality of bits based on the accumulated softbit packet and a total number of transmissions of the original packet;
   estimating a bit error rate (BER) of the network based on comparing the decision bit for each bit with the corresponding bit in each of the plurality of received packets to identify possible bit errors, accumulating the possible bit errors to generate a total number of possible bit errors, and dividing the total number of possible bit errors by a total number of the plurality of bits in the plurality of received packets to estimate the BER;
   computing bit reliability information for each bit of the plurality of bits based on the accumulated softbit packet, the total number of transmissions, and the BER, the reliability information for each bit indicating a confidence level that the bit decision for the bit is equal to a corresponding bit in the original packet; and
   providing the bit decision and the bit reliability information for each bit of the plurality of bits to aid a softbit decoder to recover the original packet.

2. The method of claim 1, wherein each of the plurality of received packets comprises a plurality of decoded hardbits and wherein accumulating the plurality of received packets comprises:
   accumulating bitwise the corresponding decoded hardbits of the plurality of packets into the corresponding accumulated softbits of the accumulated softbit packet.

3. The method of claim 1, wherein determining a bit decision for each bit of the plurality of bits comprises:
   generating a majority decision packet (MDP) based on the corresponding accumulated softbits of the accumulated softbit packet using a majority voting scheme, wherein the majority voting scheme uses a majority decision threshold that is determined by the total number of transmissions.

4. The method of claim 1, wherein computing the bit reliability information for each bit of the plurality of bits comprises:
   computing a first probability that the bit decision for each bit correctly estimates the corresponding bit in the original packet;
   computing a second probability that the bit decision for each bit incorrectly estimates the corresponding bit in the original packet; and
   computing the bit reliability information for each bit as a ratio of the first probability for each bit over a sum of the first probability and the second probability for each bit of the plurality of bits.

5. The method of claim 4, wherein computing the first probability comprises:
   setting a first bit probability of (1−BER) when a bit in one of the plurality of received packets is equal to a corresponding bit decision and setting the first bit probability to BER when the bit is not equal to the corresponding bit decision; and
   computing the first probability that the bit decision for the bit correctly estimates the corresponding bit in the original packet as a product of the first bit probability for each of the plurality of received packets,
   and wherein computing the second probability comprises:
   setting a second bit probability of BER when a bit in one of the plurality of received packets is equal to a corresponding bit decision and setting the second bit probability to (1−BER) when the bit is not equal to the corresponding bit decision; and
   computing the second probability that the bit decision for the bit incorrectly estimates the corresponding bit in the original packet as a product of the second bit probability for each of the plurality of received packets.

6. The method of claim 4, wherein computing the first probability that the bit decision for each bit correctly estimates the corresponding bit in the original packet comprises:
   computing the first probability as a ratio of the corresponding accumulated softbits with the total number of transmissions when the bit decision is 1; or
   computing the first probability as a difference between 1 and a ratio of the corresponding accumulated softbits with the total number of transmissions when the bit decision is 0,
   and wherein computing the second probability that the bit decision for each bit incorrectly estimates the corresponding bit in the original packet comprises:
   computing a difference between 1 and the first probability for the bit decision.

7. The method of claim 1, further comprising:
   performing a cyclic redundancy check (CRC) on the bit decision for the plurality of bits; and
   setting the bit reliability information for each bit of the plurality of bits to a maximum value when the CRC passes.

8. The method of claim 1, wherein the network comprises a Bluetooth Low Energy (BLE) network and the original packet comprises a BLE packet.

9. A receiver, comprising:
   a wireless interface configured to receive a plurality of packets over a network, the plurality of packets including an original packet and one or more retransmissions of the original packet, the original packet including a plurality of bits;
   a processing device configured to:
   accumulate the plurality of received packets for each bit of the plurality of bits into corresponding accumulated softbits of an accumulated softbit packet;
   determine a bit decision for each bit of the plurality of bits based on the accumulated softbit packet and a total number of transmissions of the original packet;
   estimate a bit error rate (BER) of the network based on the processing device being configured to compare the decision bit for each bit with the corresponding bit in each of the plurality of received packets to identify possible bit errors, accumulate the possible bit errors to generate a total number of possible bit errors, and divide the total number of possible bit errors by a total number of the plurality of bits in the plurality of received packets to estimate the BER;
   compute bit reliability information for each bit of the plurality of bits based on the accumulated softbit packet, the total number of transmissions, and the BER, the reliability information for each bit indicating a confidence level that the bit decision for the bit is equal to a corresponding bit in the original packet; and
   transmit the bit decision and the bit reliability information for each bit of the plurality of bits to aid a softbit decoder to recover the original packet.

10. The receiver of claim 9, wherein each of the plurality of received packets comprises a plurality of decoded hardbits, and wherein the processing device configured to accumulate the plurality of received packets comprises the processing device configured to:
  accumulate bitwise the corresponding decoded hardbits of the plurality of packets into the corresponding accumulated softbits of the accumulated softbit packet.

11. The receiver of claim 9, wherein the processing device configured to determine a bit decision for each bit of the plurality of bits comprises the processing device configured to:
  generate a majority decision packet (MDP) based on the corresponding accumulated softbits of the accumulated softbit packet using a majority voting scheme, wherein the majority voting scheme uses a majority decision threshold that is determined by the total number of transmissions.

12. The receiver of claim 9, wherein the processing device configured to compute the bit reliability information for each bit of the plurality of bits comprises the processing device configured to:
  compute a first probability that the bit decision for each bit correctly estimates the corresponding bit in the original packet;
  compute a second probability that the bit decision for each bit incorrectly estimates the corresponding bit in the original packet; and
  compute the bit reliability information for each bit as a ratio of the first probability for each bit over a sum of the first probability and the second probability for each bit of the plurality of bits.

13. The receiver of claim 12, wherein
  the processing device configured to compute the first probability comprises the processing device configured to:
  set a first bit probability of (1−BER) when a bit in one of the plurality of received packets is equal to a corresponding bit decision and set the first bit probability to BER when the bit is not equal to the corresponding bit decision; and
  compute the first probability that the bit decision for the bit correctly estimates the corresponding bit in the original packet as a product of the first bit probability for each of the plurality of received packets,
  and wherein the processing device configured to compute the second probability comprises the processing device configured to:
  set a second bit probability of BER when a bit in one of the plurality of received packets is equal to a corresponding bit decision and set the second bit probability to (1−BER) when the bit is not equal to the corresponding bit decision; and
  compute the second probability that the bit decision for the bit incorrectly estimates the corresponding bit in the original packet as a product of the second bit probability for each of the plurality of received packets.

14. The receiver of claim 12, wherein the processing device configured to compute the first probability that the bit decision for each bit correctly estimates the corresponding bit in the original packet comprises the processing device configured to:
  compute the first probability as a ratio of the corresponding accumulated softbits with the total number of transmissions when the bit decision is 1; or
  compute the first probability as a difference between 1 and a ratio of the corresponding accumulated softbits with the total number of transmissions when the bit decision is 0,
  and wherein the processing device configured to compute the second probability that the bit decision for each bit incorrectly estimates the corresponding bit in the original packet comprises the processing device configured to:
  compute a difference between 1 and the first probability for the bit decision.

15. The receiver of claim 9, wherein the processing device is further configured to:
  perform a cyclic redundancy check (CRC) on the bit decision for the plurality of bits; and
  set the bit reliability information for each bit of the plurality of bits to a maximum value when the CRC passes.

16. The receiver of claim 9, wherein the wireless interface comprises a Bluetooth Low Energy (BLE) interface and wherein the original packet comprises a BLE packet received over a BLE network.

17. A communication device, comprising:
  one or more antennas configured to receive a plurality of audio packets over a network, the plurality of audio packets including an original audio packet and one or more retransmissions of the original audio packet, the original audio packet including a plurality of bits;
  one or more speakers; and
  a processing device connected to the one or more antennas, the processing device configured to:
  accumulate the plurality of received audio packets for each bit of the plurality of bits into corresponding accumulated softbits of an accumulated softbit packet;
  determine a bit decision for each bit of the plurality of bits based on the accumulated softbit packet and a total number of transmissions of the original audio packet;
  estimate a bit error rate (BER) of the network based on the processing device being configured to compare the decision bit for each bit with the corresponding bit in each of the plurality of received audio packets to identify possible bit errors, accumulate the possible bit errors to generate a total number of possible bit errors, and divide the total number of possible bit errors by a total number of the plurality of bits in the plurality of received audio packets to estimate the BER;
  compute bit reliability information for each bit of the plurality of bits based on the accumulated softbit packet, the total number of transmissions, and the BER, the reliability information for each bit indicating a confidence level that the bit decision for the bit is equal to a corresponding bit in the original audio packet;
  perform softbit decoding aided by the bit decision and the bit reliability information for each bit of the plurality of bits to recover the original audio packet; and
  providing the recovered original audio packet to the one or more speakers for playback.

18. The communication device of claim 17, wherein the processing device configured to determine a bit decision for each bit of the plurality of bits comprises the processing device configured to:
  generate a majority decision packet (MDP) based on the corresponding accumulated softbits of the accumulated softbit packet using a majority voting scheme, wherein the majority voting scheme uses a majority decision threshold that is determined by the total number of transmissions.

\* \* \* \* \*